(12) United States Patent
Kawanishi (10) Patent No.: US 7,041,229 B2
(45) Date of Patent: May 9, 2006

(54) PATTERNED PRODUCT AND ITS MANUFACTURING METHOD

(75) Inventor: Yoshitaka Kawanishi, Tokyo (JP)

(73) Assignee: Pioneer Corporation, Tokyo (JP)

( * ) Notice: Subject to any disclaimer, the term of this patent is extended or adjusted under 35 U.S.C. 154(b) by 262 days.

(21) Appl. No.: 10/194,542

(22) Filed: Jul. 12, 2002

(65) Prior Publication Data

US 2003/0027425 A1   Feb. 6, 2003

(30) Foreign Application Priority Data

Jul. 12, 2001   (JP)   ............... 2001-211555

(51) Int. Cl.
  *B44C 1/22*   (2006.01)
(52) U.S. Cl. ............... 216/41; 216/42; 216/44; 216/89
(58) Field of Classification Search ............... 216/41, 216/42, 44, 52, 89
See application file for complete search history.

(56) References Cited

U.S. PATENT DOCUMENTS 4,594,265 A * 6/1986 Van Vonno et al. ........ 438/385
5,506,720 A * 4/1996 Yoon ........................... 359/224
5,851,928 A * 12/1998 Cripe et al. .................. 438/748
6,340,812 B1 * 1/2002 Izumi et al. ............. 250/208.1
6,475,068 B1 * 11/2002 Jimbo et al. .................. 451/57

FOREIGN PATENT DOCUMENTS

| JP | 07-282730   | 10/1995 |
| JP | 09-092135   | 4/1997  |
| JP | 2000-123747 | 4/2000  |
| JP | 2001-035365 | 2/2001  |

* cited by examiner

Primary Examiner—Nadine G. Norton
Assistant Examiner—Binh X. Tran
(74) Attorney, Agent, or Firm—Drinker Biddle & Reath LLP

(57) ABSTRACT

To provide a manufacturing method for simultaneously forming machined patterns different in dept in a small number of steps and a machined pattern having a U-shaped sectional form in which depths and widths are smoothly changed. Mask patterns 62 respectively having a semicircular sectional form and mask patterns 65 respectively having a V-shaped sectional form are formed at different opening widths 63 and 64 respectively to perform sandblasting by using the mask patterns 62 and 65 as masks. Though a deep groove is formed between the semicircular-sectional-form mask patterns 62, a shallow groove is formed between the V-shaped-sectional-form mask patterns 65.

14 Claims, 12 Drawing Sheets

30 GLASS SUBSTRATE
31 WORK PIECE
32 MASK PATTERN
33,34 REGION

1 MAXIMUM INFLUENCING
  POINT OF STRIPPING FLOW
2 MAXIMUM INFLUENCING
  DISTANCE OF STRIPPING FLOW
3 STRIPPING POINT
4 FOOT
5 PLANE
6,6A VISCOUS FLOW
7 STRIPPING FLOW

FIG.2D 2B,2C,2D,2E
MAXIMUM INFLUENCING
DISTANCE OF STRIPPING FLOW 3B,3C
STRIPPING POINT 6B,6C VISCOUS FLOW 7B,7C,7D,7E
STRIPPING FLOW

10 OPAQUE
11 SLIT

12 OPAQUE
13 SLIT

16 OPAQUE
17 SLIT

18 OPAQUE
19 SLIT

20 GLASS SUBSTRATE
21 WORK PIECE
22 RESIST LAYER
23 EXPOSURE MASK
24 MASK PATTERN
25 PATTERNED PRODUCT

FIG.13

30 GLASS SUBSTRATE
31 WORK PIECE
32 MASK PATTERN
33,34 REGION

101 GLASS SUBSTRATE
102 WORK PIECE
103 RESIST LAYER
104 EXPOSURE MASK
104A,104B EXPOSURE MASK PATTERN

113 MASK
113A,113B MASK PATTERN
115 MASK-PATTERN-END CENTER
116 MASK-PATTERN-END VERTEX

FIG.19A  FIG.19B 105,108 DISCHARGE SPACE
106,109 EXHAUST GROOVE
107,110 EXHAUST-GROOVE BOTTOM

FIG.20

FIG.21

# PATTERNED PRODUCT AND ITS MANUFACTURING METHOD

BACKGROUND OF THE INVENTION

1. Field of the Invention

The present invention relates to a patterned product and its manufacturing method, particularly to a patterned product such as any of a partition of a discharge cell of a plasma display and a groove formed on the partition and its manufacturing method according to a polishing method using a jet flow.

2. Description of the Related Art

A sandblasting method of a two-phase flow of solid using air and abrasive is generally used as a typical polishing method using a jet flow.

As a typical workpiece to be patterned through sandblasting after forming a mask pattern on a machined surface, a discharge cell pattern is known which is formed on the substrate of a display panel such as a plasma display panel or PALC (plasma address liquid crystal) display panel. In this case, it is frequently required to form a plurality of machined patterns having different heights.

For example, the official gazette of Japanese Patent Laid-Open No. 2000-123747 discloses a method for forming a workpiece for a shallow machined pattern and a mask pattern on a substrate and moreover forming a workpiece for a deep machined pattern and a mask pattern on the former workpiece and mask pattern again, and then forming machined patterns having different depths on the substrate of a display panel through sandblasting.

Moreover, the official gazette of Japanese Patent Laid-Open No. Hei 7-282730 discloses a method for forming a shallow machined pattern and a deep machined pattern by alternately repeating mask-pattern forming, sandblasting, and drying and moreover forming a machined pattern on a part of the shallow machined pattern.

Problems to be Solved by the Invention:

However, even in the case of any one of the above conventional patterned products and their manufacturing methods, it is necessary to repeat a step of applying a work piece on a substrate and a step of forming a mask pattern several times. Therefore, the conventional patterned products and their manufacturing methods have a problem that the number of steps is increased and a problem that it is difficult to align a shallow machined pattern and a deep machined pattern. Moreover, the latter prior art has a problem that a polishing step according to sandblasting must be performed several times.

SUMMARY OF THE INVENTION

The present invention is made to solve the above problems and its object is to provide a manufacturing method capable of simultaneously manufacturing machined patterns having different depths in a small number of steps without using a plurality of mask forming steps and a patterned product manufactured by the manufacturing method.

To achieve the above object, the present invention provides a patterned product in which a plurality of chambers are separated by a partition and the chambers are connected by a groove formed on the partition and the bottom face of the groove is formed into a U-shape.

Moreover, it is preferable that the groove is gradually deepened toward chambers from the center between chambers. Furthermore, it is preferable that the width of the groove smoothly changes.

Furthermore, the present invention provides a patterned-product manufacturing method comprising the step of:

(1) forming a workpiece on a substrate;
(2) forming a mask pattern on the workpiece; and
(3) machining the workpiece by a polishing method using a viscous flow by using the mask pattern as a mask, wherein at least two machined patterns having different depths are simultaneously formed.

DESCRIPTION OF THE PREFERRED EMBODIMENTS

Before describing embodiments of the present invention, the theory and technical background of the present invention are described.

As a result of earnest study, the present inventor finds that the flow-rate distribution of viscous flows formed by a fluid and an abrasive directly influences a machined shape of a workpiece by explaining jet machining such as sandblasting in accordance with the fluid dynamics, moreover confirms that the maximum distance to be influenced by a stripping flow can be adjusted by the opening width between and sectional forms of mask patterns for machining a workpiece, and succeeds in simultaneously forming machined patterns having different depths by using the above phenomenon.

Figure 1:
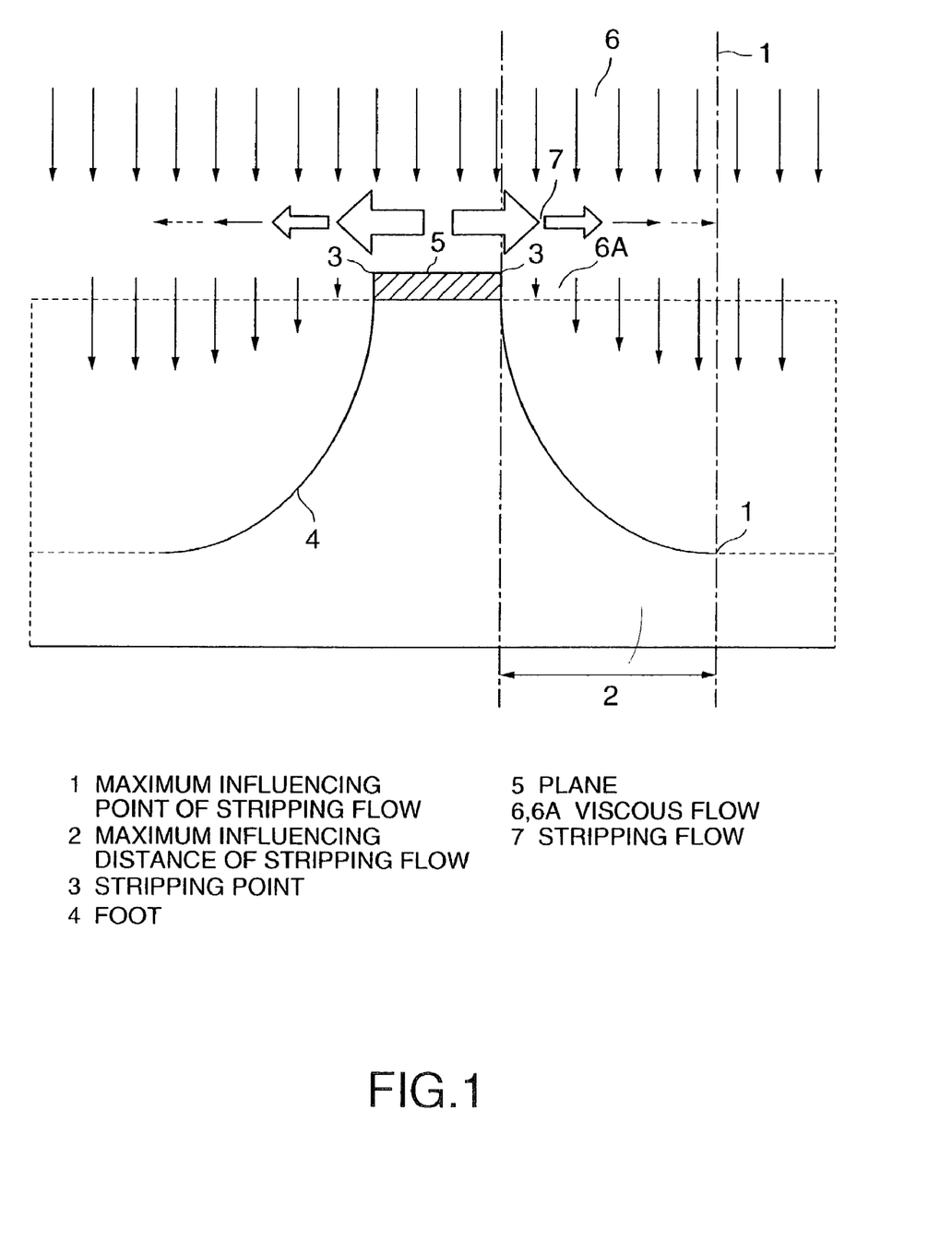
FIG. 1 is a sectional view for explaining the technical background of the present invention.

FIG. 1 is a sectional view for explaining the technical background of the present invention. Moreover, FIGS. 2A to 2D and FIGS. 3A and 3B are sectional views for explaining the theory of the present invention.

As shown in FIG. 1, in the fluid dynamic, when a limited-size plane 5 is present in a uniform viscous flow 6 vertically to the direction of the viscous flow 6, the flow of the viscous flow 6 is radially separated nearby the center (stagnant point) of the plane 5 and flows along the plane 5 and then, it is discharged as a flow referred to as a stripping flow 7 having a flow component vertical to the direction of the viscous flow 6 at an end of the plane 5. The end of the plane 5 from which the stripping flow 7 is discharged is referred to as a stripping point 3. The stripping flow 7 is discharged from the stripping point 3 at a constant flow rate and joins with the uniform viscous flow 6 coming from the upstream side. A viscous flow 6A joined with the stripping flow 7 nearby the stripping point 3 is extremely decelerated due to the stripping flow 7. However, the influence of the stripping flow 7 is gradually decreased as the distance from the stripping point 3 increases in the horizontal direction of the paper surface and finally, the flow rate of the viscous flow 6A becomes equal to that of the viscous flow 6 before reaching the plane 5 at a certain point. That is, when an object is present in a uniform viscous flow, a stripping flow occurs and a velocity gradient occurs in the viscous flow nearby the object.

In the case of the present invention, a point at which the flow rate of a viscous flow nearby an object becomes equal to that of a uniform viscous flow is defined as the maximum influencing point 1 of a stripping flow and the distance in the horizontal direction of the paper surface from a tripping point up to the maximum influencing point 1 of the stripping flow is defined as the maximum influencing point 2 of the stripping flow.

The uniform viscous flow and limited-size plane used for the above description correspond to a two-phase flow of solid formed by a compressed air and abrasive and a flat-surface mask for sandblasting respectively in sandblasting.

When a viscous flow comes up to the height of a mask under sandblasting, the flow rate of the viscous flow in the vertical direction on the paper surface has a flow-rate distribution that the flow rate decreases at a mask end due to joining with a slow stripping flow discharged from the mask end and increases as the distance from the mask end increases, and becomes equal to the flow rate of a uniform two-phase flow of solid before reaching the mask at the maximum influencing point 1 of a stripping flow where there is not the influence of the stripping flow. In this case, when a workpiece is present at the downstream side of the mask, the polishing rate nearby the mask end is low because the polishing rate is proportional to a flow rate but it gradually rises as the distance from the mask in the horizontal direction of the paper surface increases and becomes constant after passing through the maximum influencing point 1 of the stripping flow. Thereby, the sectional form of the workpiece has a shape like Mt. Fuji having its foot 4.

Figure 2A:
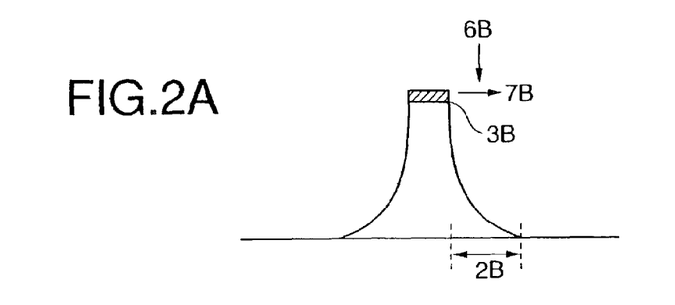
FIGS. 2A to 2D are sectional views (No. 1) for explaining the theory of the present invention.
Figure 2B:
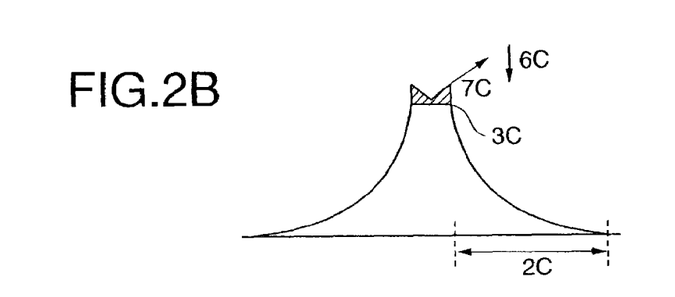
Figure 2C:
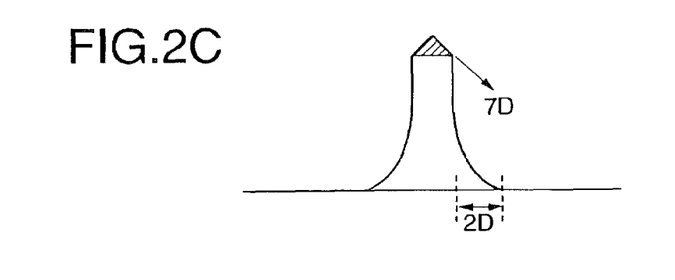
Figure 2D:
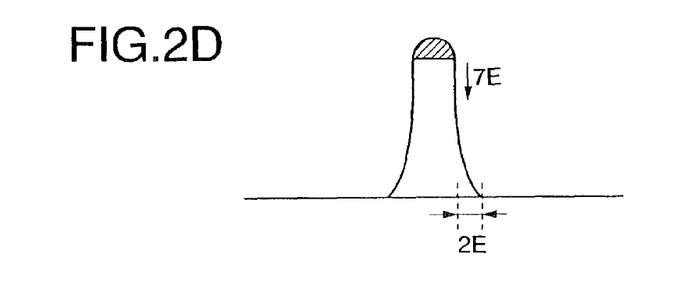

Then, influences of the shape of a mask on a stripping flow and the maximum influencing distance of the stripping flow are described below by referring to FIG. 2. When the upper face of a mask is flat, that is, the sectional form of the mask is rectangular, a stripping flow 7B has a maximum influencing distance 2B of a certain stripping flow as described above because the flow 7B joins with a viscous flow 6B of a two-phase flow of solid and gas horizontally jetted from a stripping point 3B at the end of the mask (FIG. 2A). Therefore, when the sectional form of a mask is V-shaped (or U-shaped or W-shaped), a stripping flow 7C is jetted diagonally upward against the flow direction of a viscous flow 6C of a two-phase flow of solid and gas, in a stripping point 3c at the end of the mask. Therefore, the flow rate of the viscous flow 6C of the two-phase flow of solid and gas is extremely decelerated and the maximum influencing distance 2C of a stripping flow increases compared to the case in which the sectional form of a mask is rectangular (FIG. 2B). When the sectional form of a mask is triangular, a stripping flow 7D is jetted diagonally downward along a slope of a triangle and the maximum influencing distance 2D of the stripping flow decreases compared to the case in which the sectional form of a mask is rectangular (FIG. 2C). When the sectional form of a mask is semicircular, the maximum influencing distance 2E of a stripping flow 7E further decreases because the stripping flow 7E occurs at a lower portion and the formed shape of a patterned product approaches from the shape like Mt. Fuji to a cylindrical shape.

Then, the case is described in which two linear mask patterns are present in parallel vertically to the flow direction of a viscous flow of a uniform two-phase flow of solid and gas. FIGS. 3 to 6 are sectional views of a patterned product produced when decreasing the opening width between these two linear mask patterns. In each illustration, A shows a sectional view when using a mask pattern whose sectional form is rectangular and B shows a sectional view when using a mask pattern whose sectional form is triangular.

Figure 3A:
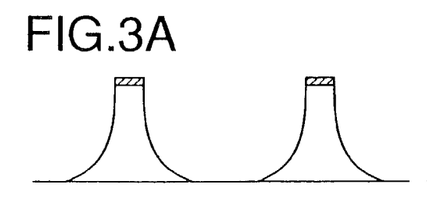
FIGS. 3A and 3B are sectional views (No. 2) for explaining the theory of the present invention.
Figure 3B:
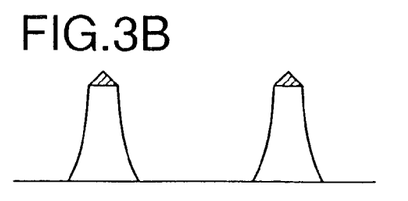
Figure 4A:
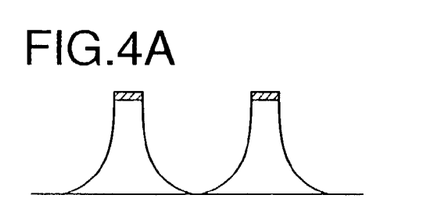
FIGS. 4A and 4B are sectional views (No. 3) for explaining the theory of the present invention.
Figure 4B:
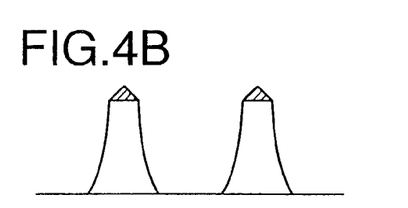
Figure 5A:
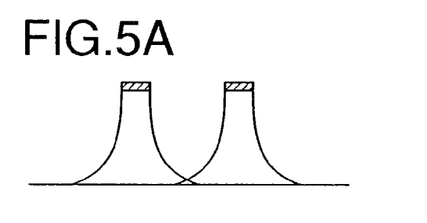
FIGS. 5A and 5B are sectional views (No. 4) for explaining the theory of the present invention.
Figure 5B:
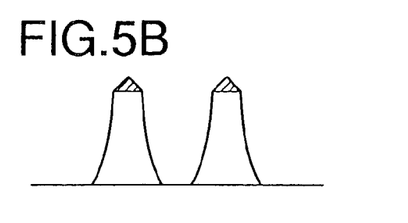
Figure 6A:
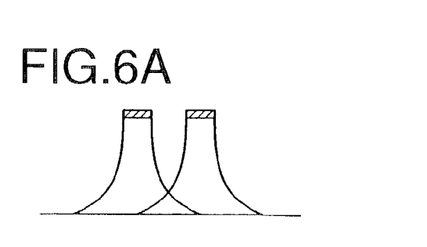
FIGS. 6A and 6B are sectional views (No. 5) for explaining the theory of the present invention.
Figure 6B:
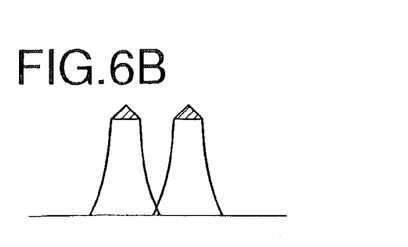

When the opening width between the both mask patterns is equal to or more than the maximum influencing distance of a stripping flow, the sectional form of a workpiece has a pan-bottom shape in which two Mt.-Fuji shapes respectively having a wide foot are arranged (FIGS. 3A and 3B). When using mask patterns whose sectional forms are rectangular and decreasing the opening width between the both mask patterns, the sectional form of a workpiece becomes U-shaped when the opening width becomes equal to the maximum influencing distance of a stripping flow (FIG. 4A). When using mask patterns whose sectional forms are triangular, the sectional form of the workpiece still keeps the pan-bottom shape because the maximum influencing distance of the stripping flow is smaller than the case of using a mask pattern whose sectional form is rectangular (FIG. 4B). Moreover, when using mask patterns whose sectional forms are rectangular and further decreasing the opening width, the opening width becomes two times or less the maximum influencing distance of the stripping flow and a stripping flow discharged from the end of one mask pattern influences even a viscous flow to the workpiece below the other mask pattern, the polishing rate of the portion of the workpiece is further decreased, the sectional form of the workpiece becomes a U-shaped sectional form close to a V-shaped sectional form in which two shapes like Mt. Fuji respectively having a narrow foot are arranged, and the machined depth is decreased (FIG. 5A). However, when using mask patterns whose sectional forms are triangular, the sectional form of the workpiece still keeps the pan-bottom shape or barely reaches a U-shape (FIG. 5B). When further decreasing the opening width, the foot of the sectional form of the workpiece is further narrowed and the machined depth is further decreased (FIG. 6A). However, when using mask patterns whose sectional forms are triangular, the machined depth of the workpiece barely becomes shallow (FIG. 6B).

As described above, by adjusting sectional forms and/or the opening width of or between mask patterns, it is possible to machine a workpiece up to various depths.

Then, embodiments of the present invention are described in detail by referring to the accompanying drawings.

FIGS. 7 to 11 are sectional views (B) of mask patterns and top views (A) of exposure masks for manufacturing the mask patterns.

In the case of this embodiment, an exposure mask for preparing a mask pattern used to machine a workpiece through sandblasting is manufactured through photolithography.

The mask-pattern-preparing exposure mask of this embodiment has a plurality of slit-like holes at the mask-pattern exposure section. In this case, a negative resist material is assumed as the resist material for forming a mask pattern. When using a positive resist material, it is necessary to reverse the position of roughness and fineness of slits formed on an exposure mask described below.

Figure 7A:
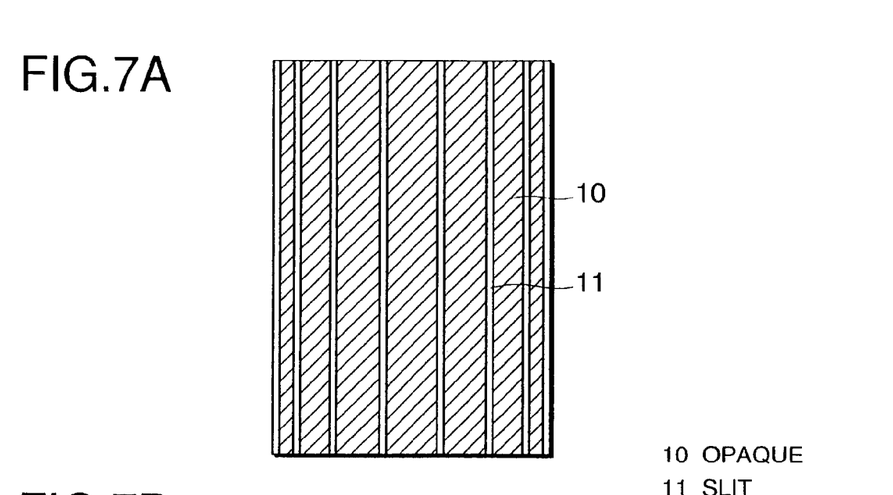
FIGS. 7A and 7B are a sectional view (B) of a mask pattern used for a manufacturing method of the present invention and a top view (A) of an exposure mask for forming the mask pattern (No. 1)
Figure 7B:
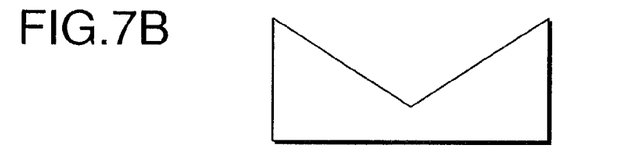
Figure 8A:
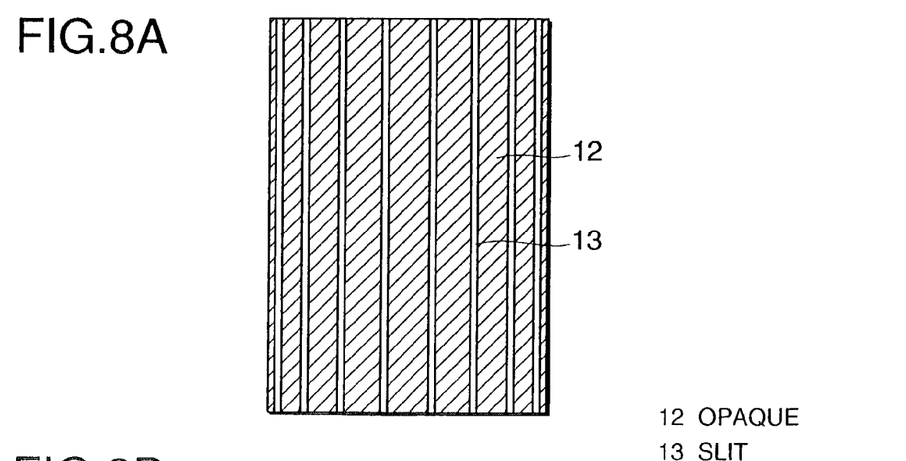
FIGS. 8A and 8B are a sectional view (B) of a mask pattern used for a manufacturing method of the present invention and a top view (A) of an exposure mask for forming the mask pattern (No. 2)
Figure 8B:
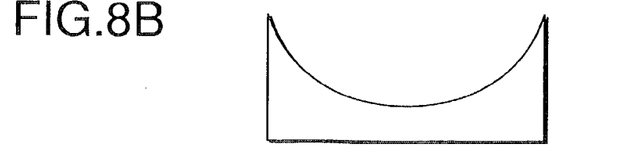
Figure 9A:
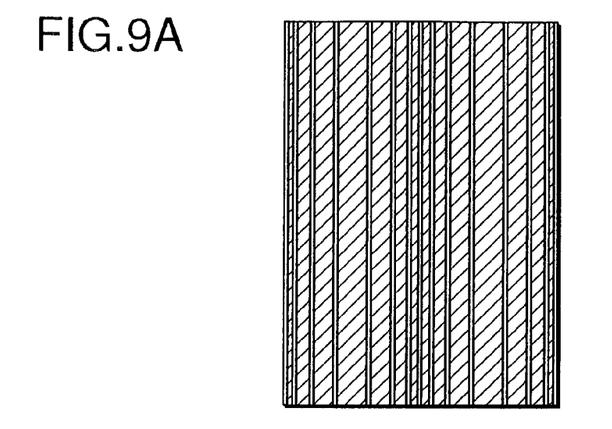
FIGS. 9A and 9B are a sectional view (B) of a mask pattern used for a manufacturing method of the present invention and a top view (A) of an exposure mask for forming the mask pattern (No. 3)
Figure 9B:
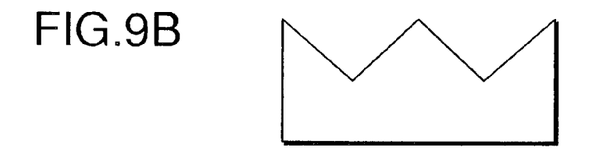
Figure 10A:
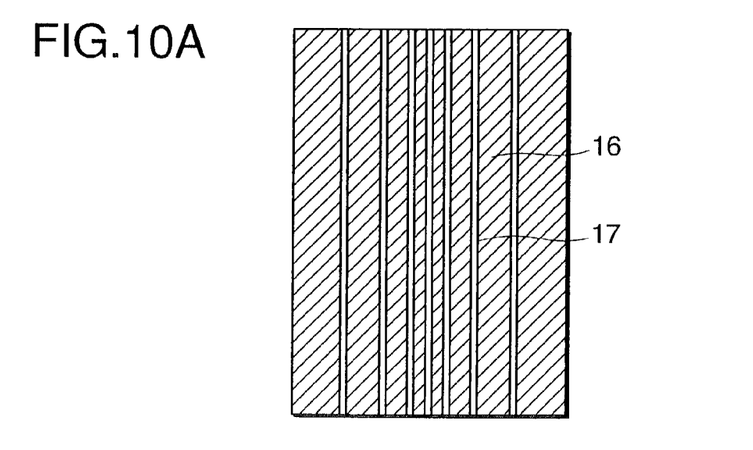
FIGS. 10A and 10B are a sectional view (B) of a mask pattern used for a manufacturing method of the present invention and a top view (A) of an exposure mask for forming the mask pattern (No. 4)
Figure 10B:
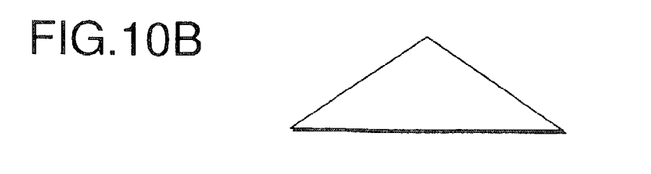
Figure 11A:
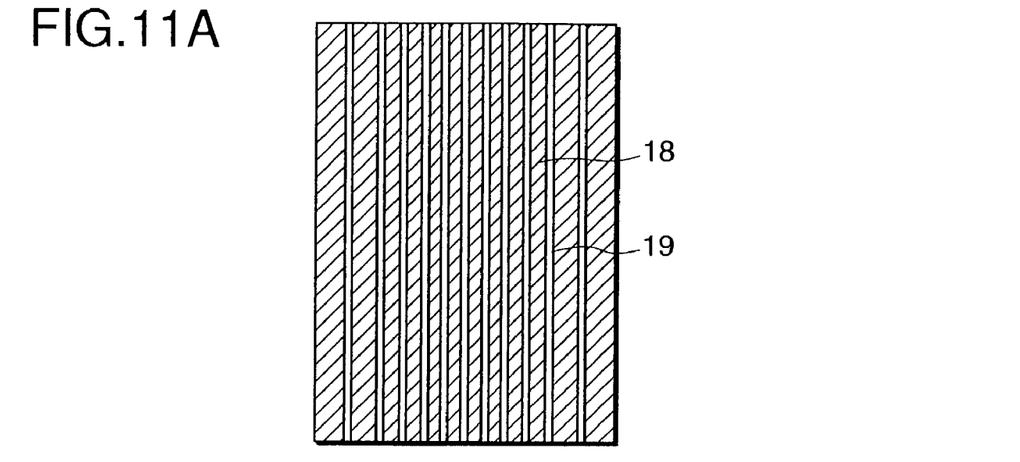
FIGS. 11A and 11B are a sectional view (B) of a mask pattern used for a manufacturing method of the present invention and a top view (A) of an exposure mask for forming the mask pattern (No. 5)
Figure 11B:
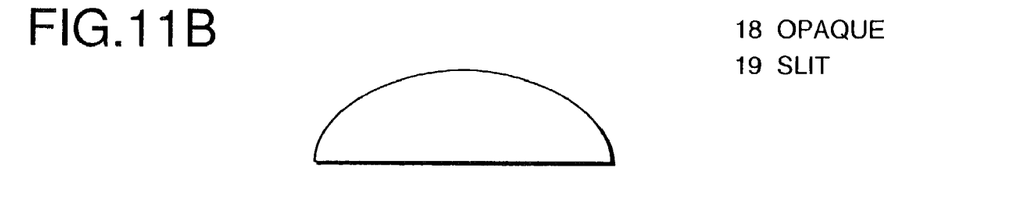

First, an exposure mask (FIG. 7A) for forming a mask pattern (FIG. 7B) whose sectional form is V-shaped is described. As shown in FIG. 7A, an exposure mask for forming a mask pattern whose sectional form is V-shaped is constituted by forming a lot of slits 11 on an opaque 10. Though widths of the slits 11 are constant, the spatial density of the slits 11 rises from the center of the opaque 10 in the horizontal direction of the paper surface toward the outside of the body 10. In the case of an exposure mask for forming a mask pattern whose sectional form is V-shaped, it is proper to raise the spatial density at which the slits 11 are formed proportionally to a distance from the center of the opaque 10 in the horizontal direction of the paper surface toward the outside of the body 10. In the case of an exposure mask for forming the mask pattern whose sectional form is U-shaped as shown in FIG. 8B, it is proper to lower the spatial density at which slits 13 are formed inversely proportionally to ½ power of a distance from the outside of an opaque 12 in the horizontal direction of the paper surface toward the center of the opaque 12 as shown in FIG. 8A. In the case of an exposure mask for forming the mask pattern whose sectional form is W-shaped as shown in FIG. 9B, a slit arrangement is proper in which two exposure masks for respectively forming the mask pattern whose sectional form is V-shaped as shown in FIG. 7A are arranged in the horizontal direction of the paper surface as shown in FIG. 9A. In the case of an exposure mask for forming the triangular mask pattern shown in FIG. 10B, it is proper to raise the spatial density at which slits 17 are formed proportionally to a distance from the outside of an opaque 16 in the horizontal direction of the paper surface toward the center of the opaque 16 as shown in FIG. 10A. In the case of an exposure mask for forming the mask pattern whose sectional form is semicircular shown in FIG. 11B, it is proper to raise the spatial density at which slits 19 are formed proportionally to a power from ½ to ⅓ power of a distance from the outside of an opaque 18 in the horizontal direction of the paper surface toward the outside of the opaque 18. In this case, the distance from the outside in the horizontal direction of the paper surface toward the center or distance from the center toward the outside denotes a distance normalized by the distance between the outside end and the center in the horizontal direction of the paper surface.

In the case of the above embodiment, an exposure mask is formed by making widths of slits constant and providing a distribution for the spatial density of the slits. However, it is also allowed to provide a distribution for slit widths by making the spatial density of slits constant. That is, it is allowed to form slits by replacing the height of the spatial density of the above exposure mask with a slit width. Thereby, it is possible to manufacture an exposure mask having the same effect as the above exposure mask. Moreover, it is allowed to provide a distribution for the both slit width and spatial density of slits. Furthermore, it is allowed to use a translucent substrate for the substrate of an exposure mask and form a plurality of grooves having different heights correspondingly to the position of the translucent substrate. That is, it is allowed to replace the height of the spatial density of the above exposure mask with the depth of a groove and form a slit-like groove. Moreover, it is allowed to obtain the same effect by changing thicknesses of an opaque film made of Cr or the like. Also by this exposure mask, it is possible to form the mask pattern having the above sectional form by controlling the exposure value for the base material of a sandblasting mask in accordance with the position of the base material of the mask.

Figure 12A:
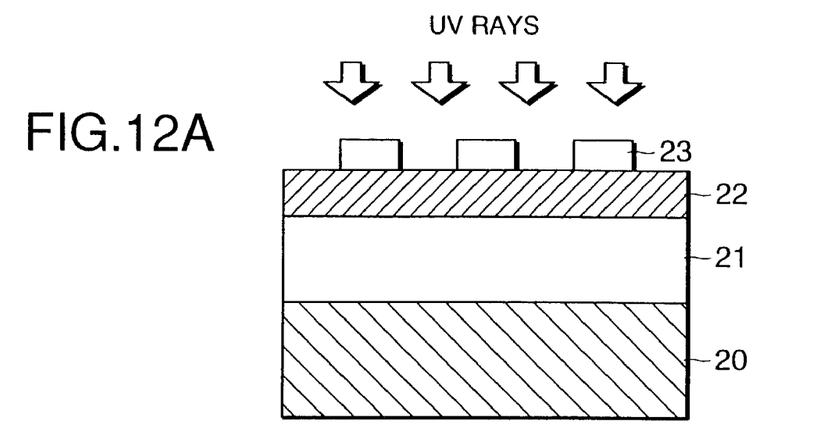
FIGS. 12A to 12C are sectional views of steps for explaining a manufacturing method of the present invention.
Figure 12B:
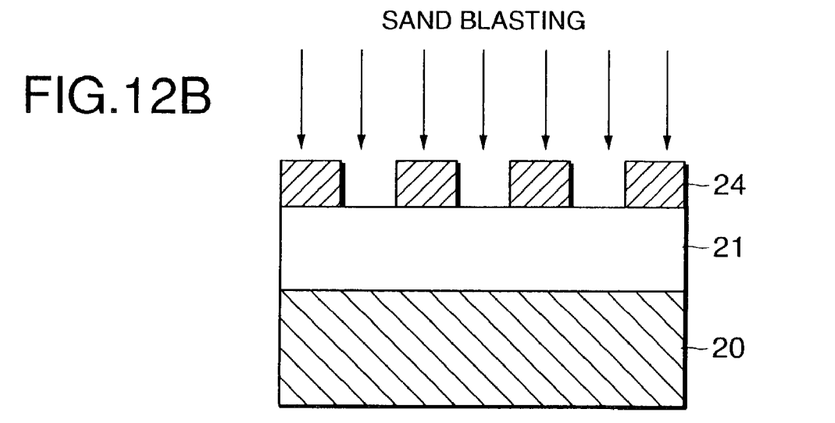
Figure 12C:
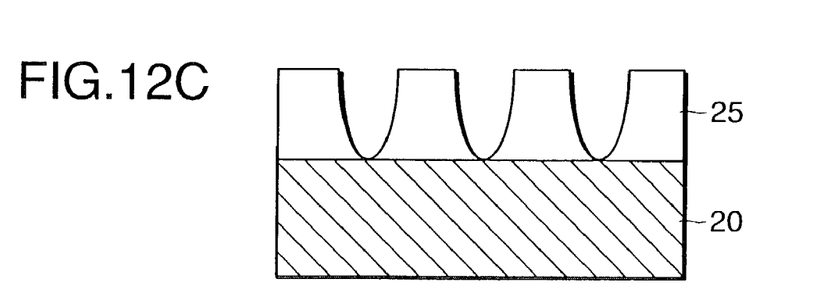

FIGS. 12A to 12C are sectional views according to the sequence of steps for explaining a manufacturing method of the present invention.

In the case of this embodiment, the base material of a mask uses a dry film resist having a resistance against sandblasting and a thickness of 40 μm. Moreover, calcium carbonate is used as an abrasive for sandblasting and mixed paste of glass and filler is used as a workpiece.

First, mixed paste of glass and filler is applied onto a glass substrate 20 and dried to form a workpiece 21 and then, a flat dry-film resist is contact-bonded to form a resist layer 22, and an exposure mask 23 is joined onto the resist layer 22 to expose the resist layer 22 with UV rays (FIG. 12A). Then, a mask pattern 24 made of the dry-film resist is obtained by developing the resist layer 22. Development is performed by spraying a 0.2 w % sodium-carbonate aqueous solution at a low pressure. Then, a patterned product 25 is formed by using the mask pattern 24 as a mask and thereby sandblasting the workpiece 21 (FIG. 12B). Then, by removing the mask pattern, patterned-product manufacturing steps of the present invention are completed (FIG. 12C).

It is possible to manufacture patterned products having various depths and sectional forms by using various patterns shown for the first embodiment as exposure masks and selecting various intervals between exposure masks.

Figure 13:
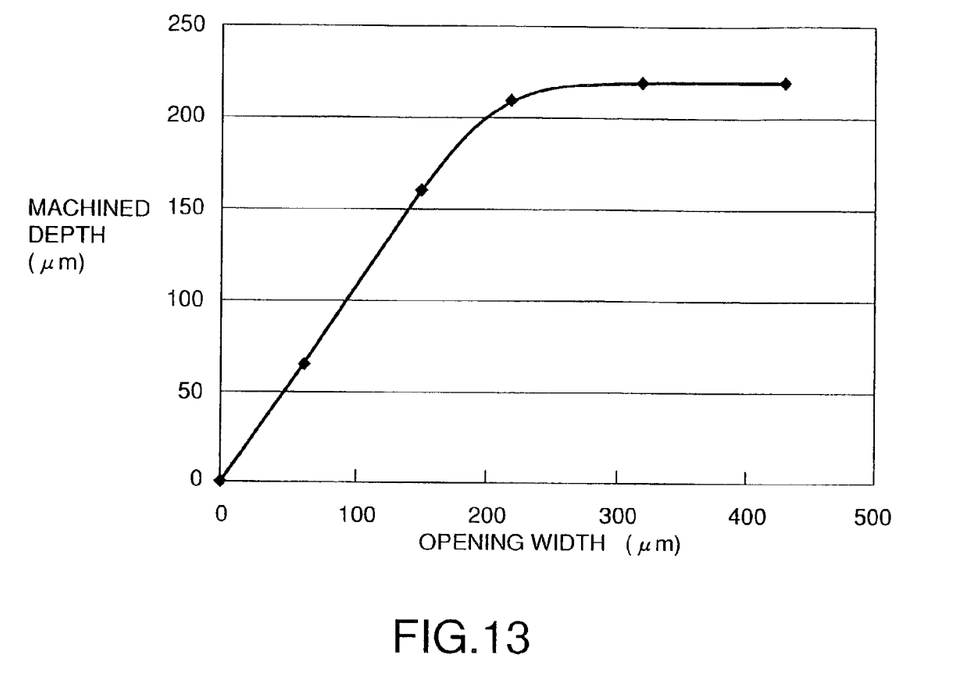
FIG. 13 is a characteristic diagram showing the relation between opening width and machined depth between and of mask patterns obtained from a manufacturing method of the present invention.

FIG. 13 is a characteristic diagram showing the relation between opening width and machined depth between or of mask patterns in a manufacturing method of the present invention, which is obtained from a mask pattern whose sectional form is rectangular.

As shown in FIG. 13, by gradually increasing the opening width between mask patterns whose sectional forms are rectangular from 100 µm or less, the machined depth is saturated nearby an opening width of 200 µm. Therefore, the maximum influencing distance of a stripping flow to the mask pattern whose sectional form is rectangular of this embodiment can be estimated as 110 µm that is a half of the opening width of 220 µm.

Then, the same measurement as the above is performed by preparing samples using mask patterns whose sectional forms are triangular, U-shaped, V-shaped, and W-shaped to calculate the maximum influencing distance of a stripping flow for the sectional form of each mask pattern. The following Table 1 shows the maximum influencing distance of a stripping flow calculated for a mask pattern having each sectional form.

TABLE 1

| Sectional form of mask pattern | Maximum influencing distance of stripping flow (µm) |
| --- | --- |
| Semicircular | 66 |
| Triangular | 94 |
| Rectangular | 110 |
| U-shaped | 132 |
| V-shaped | 132 |
| W-shaped | 172 |

As shown in the above Table 1, the maximum influencing distance of a stripping flow becomes longer from the semi-circular sectional form to the triangular, rectangular (flat), U-shaped (V-shaped), and W-shaped sectional forms.

From the above results, it is found that it is possible to simultaneously form machined patterns obtained by combining an optional opening width and depth on one workpiece.

EMBODIMENTS

Then, embodiments of the present invention are described below by referring to the accompanying drawings.

First Embodiment

Figure 14:
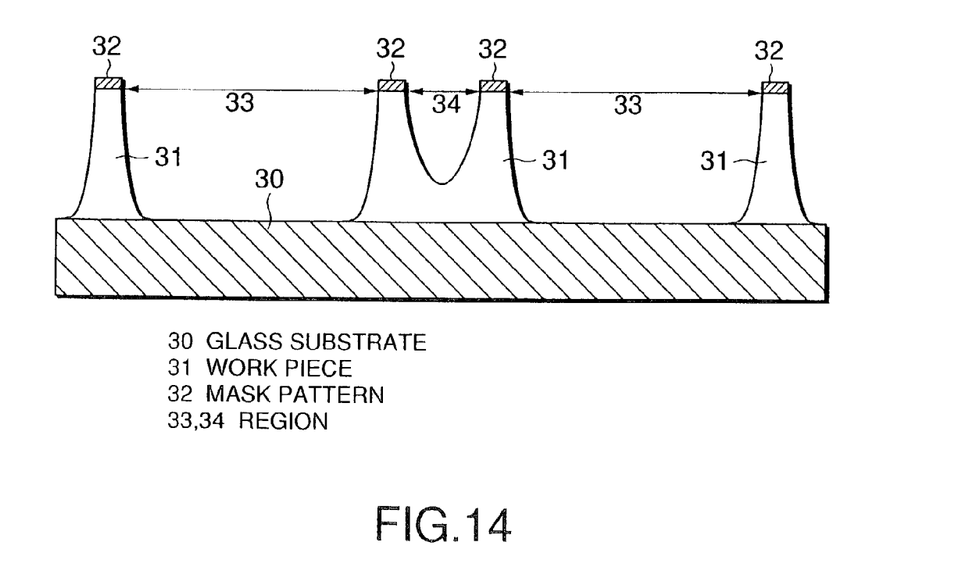
FIG. 14 is a sectional view of a patterned product of first embodiment of the present invention.

FIG. 14 is a sectional view of a patterned product of first embodiment of the present invention.

The patterned product of this embodiment shown in FIG. 14 is manufactured in accordance with the manufacturing method described by referring to FIG. 12 (the same is applied to second to fourth embodiments). Two levels of opening widths between mask patterns are set which are 350 µm in a region 33 and 80 µm in a region 34.

As shown in FIG. 14, in the region 33 where the opening width between mask patterns 32 is 350 µm, the cross section of a workpiece 31 has a pan-bottom shape in which two shapes like Mt. Fuji respectively having a wide foot are arranged. Sandblasting reaches up to the surface of the glass substrate 30 and the sandblasted depth is equal to the thickness of the workpiece before sandblasted. In the region 34 where the opening width between mask patterns is 80 µm, the cross section of the workpiece 31 is a sectional form having a U-shaped groove in which two shapes like Mt. Fuji respectively having a narrow foot are arranged. In this region, sandblasting does not reach the surface of a glass substrate 30 and the sandblasted depth becomes shallower than the former case. Therefore, even if using the same mask pattern, it is possible to form machined patterns different in depth by adjusting the opening width between mask patterns.

This represents that the maximum influencing distance of a stripping flow ranges between 175 and 40 µm when performing sandblasting by using a flat mask pattern.

Second Embodiment

Figure 15:
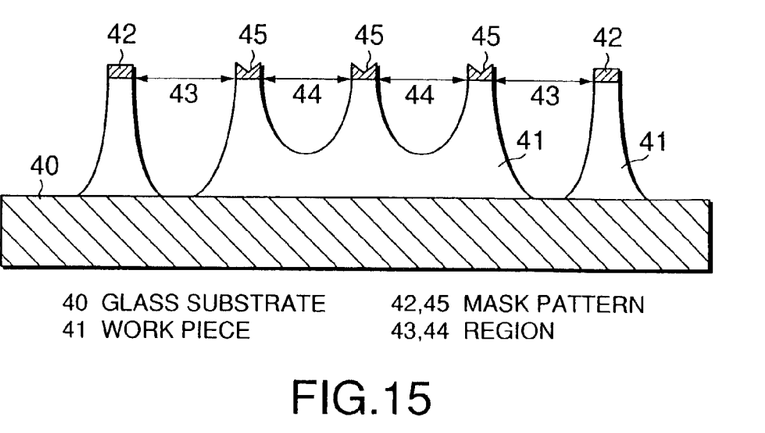
FIG. 15 is a sectional view of a patterned product of second embodiment of the present invention.

FIG. 15 is a sectional view of a patterned product of second embodiment of the present invention. In the case of this embodiment, the patterned product is formed by combining a mask pattern whose sectional form is rectangular with a mask pattern whose sectional form is V-shaped while keeping the opening width between mask patterns constant. The opening width between mask patterns is set to 120 µm that is constant.

As shown in FIG. 15, the opening width between mask patterns is 120 µm that is constant in any regions. However, in a region 43 of a mask pattern 42 in which one of adjacent mask patterns has a rectangular sectional form, the cross sect section of a workpiece 41 has a pan-bottom shape in which two shapes like Mt. Fuji respectively having a wide foot are arranged. Sandblasting reaches the surface of a glass substrate 40 and the sandblasted depth is equal to the thickness of the workpiece before sandblasted. However, in a region 44 in which both of adjacent mask patterns are mask patterns 45 whose sectional forms are V-shaped, the cross section of the workpiece 41 has a sectional form in which two shapes like Mt. Fuji respectively having a narrow foot are arranged. Sandblasting does not reach the surface of the glass substrate 40 and the sandblasted depth becomes smaller than the former case.

In the case of this embodiment, though the machined depth of the first embodiment is controlled by the opening width between mask patterns, the opening width between mask patters is constant but machined depths are changed by using a plurality of mask patterns having different sectional forms.

Third Embodiment

Figure 16:
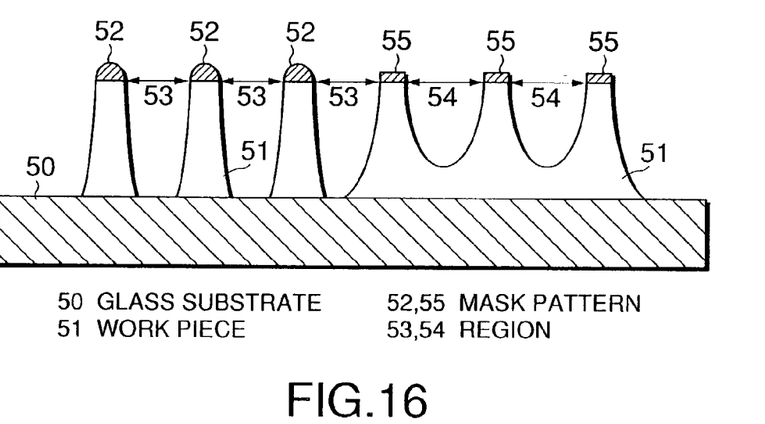
FIG. 16 is a sectional view of a patterned product of third embodiment of the present invention.

FIG. 16 is a sectional view of a patterned product of third embodiment of the present invention. In the case of this embodiment, the patterned product is formed by combining a mask pattern whose sectional form is rectangular with a mask pattern whose sectional form is semicircular while keeping the opening width between mask patterns constant. The opening width between mask patterns is set to 80 µm that is constant.

As shown in FIG. 16, the opening width between mask patterns is 80 µm in any region. However, in a region 53 in which at least one (mask pattern 52) of adjacent mask patterns has a semicircular sectional form, the cross section of a workpiece 51 has a pan-bottom shape in which two shapes like Mt. Fuji respectively having a wide foot are arranged and its machined depth is equal to the thickness of the workpiece before sandblasted. However, in a region 54 in which both of adjacent mask patterns are mask patterns 55 whose sectional forms are rectangular, the cross section of a workpiece has a U-shaped sectional form in which two shapes like Mt. Fuji respectively having a narrow foot are arranged and its machined depth is smaller than the former case and the machined bottom does not reach a glass substrate 50. Therefore, though the third embodiment is the same as the second embodiment in phenomenon, it is possible to pattern a workpiece at a high density compared to the case of the second embodiment.

Fourth Embodiment

Figure 17:
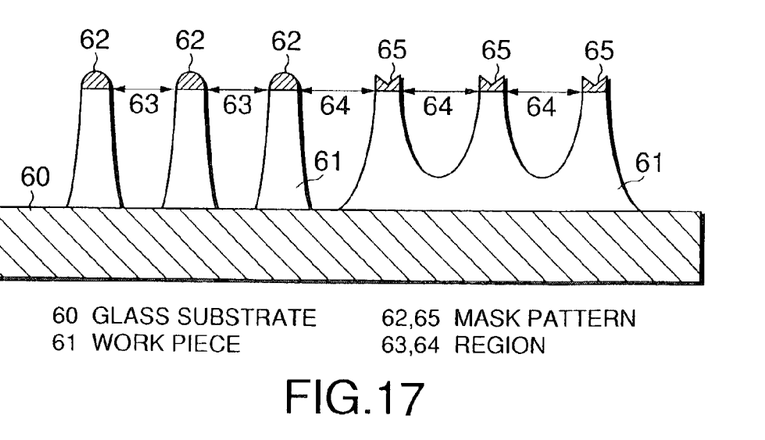
FIG. 17 is a sectional view of a patterned product of fourth embodiment of the present invention.

FIG. 17 is a sectional view of a patterned product of fourth embodiment of the present invention. In the case of this embodiment, the patterned product is formed by combining a mask pattern whose sectional form is semicircular with a mask pattern whose sectional form is V-shaped. The opening width between the mask patterns whose sectional forms are semicircular is set to 90 μm and the opening width between the mask patterns whose sectional forms are V-shaped is set to 120 μm.

As shown in FIG. 17, in a region 63 serving as mask patterns 62 in which both adjacent mask patterns have semicircular sectional forms, the opening width between the mask patterns is 90 μm and the cross section of a workpiece has a pan-bottom shape in which two shapes like Mt. Fuji respectively having a wide foot are arranged and its machined depth is equal to the thickness of the workpiece before sandblasted. However, in a region 64 serving as mask patterns 65 in which at least one of adjacent mask patterns has a V-shaped sectional form, the opening width between mask patterns is 120 μm and the cross section of a workpiece 61 has a U-shaped sectional form in which two shapes like Mt. Fuji respectively having a narrow foot are arranged, its machined depth is smaller than the former case, and the machined bottom does not reach a glass substrate 60. Therefore, in the case of this embodiment, a combination of small-opening-width and deep-machined patterns with large-opening-width and shallow machined patterns is obtained though a combination of large-opening-width and deep-machined patterns with small-opening-width and shallow-machined patterns is obtained in the case of the third embodiment.

Fifth Embodiment

Fifth embodiment of the present invention is described below by referring to FIGS. 18 and 19. In the case of this embodiment, a partition for constituting the discharge space and exhaust groove of a plasma display panel is prepared. FIGS. 18A and 18B are perspective views of steps for explaining the manufacturing method of this embodiment. FIG. 19A shows a top view and sectional view of the discharge space and exhaust groove of the display panel of this embodiment and FIG. 19B shows a top view and sectional view of the discharge space and exhaust groove of a display panel of the prior art.

Figure 18A:
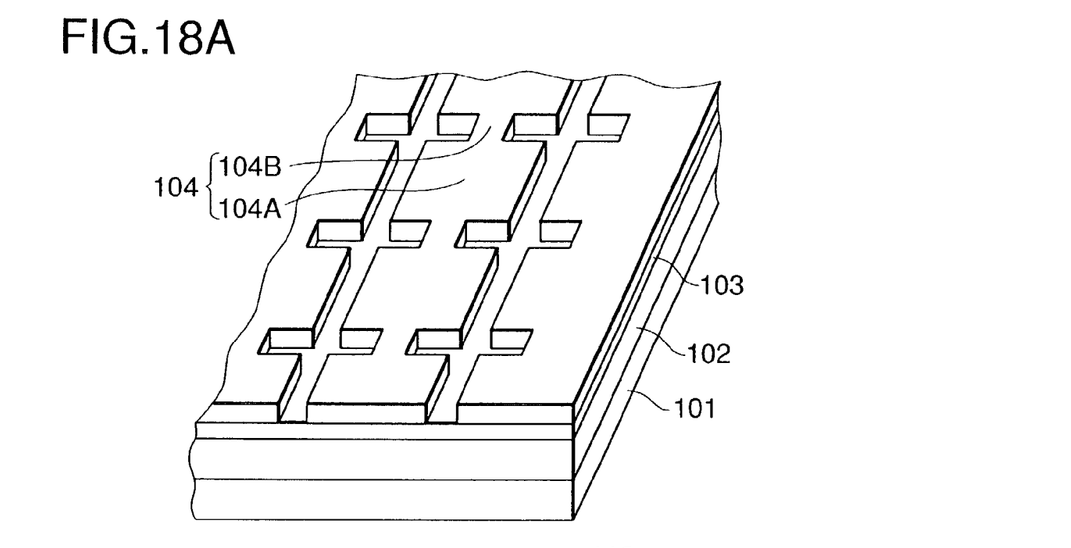
FIGS. 18A and 18B are perspective views of steps for explaining a manufacturing method of fifth embodiment of the present invention.
Figure 18B:
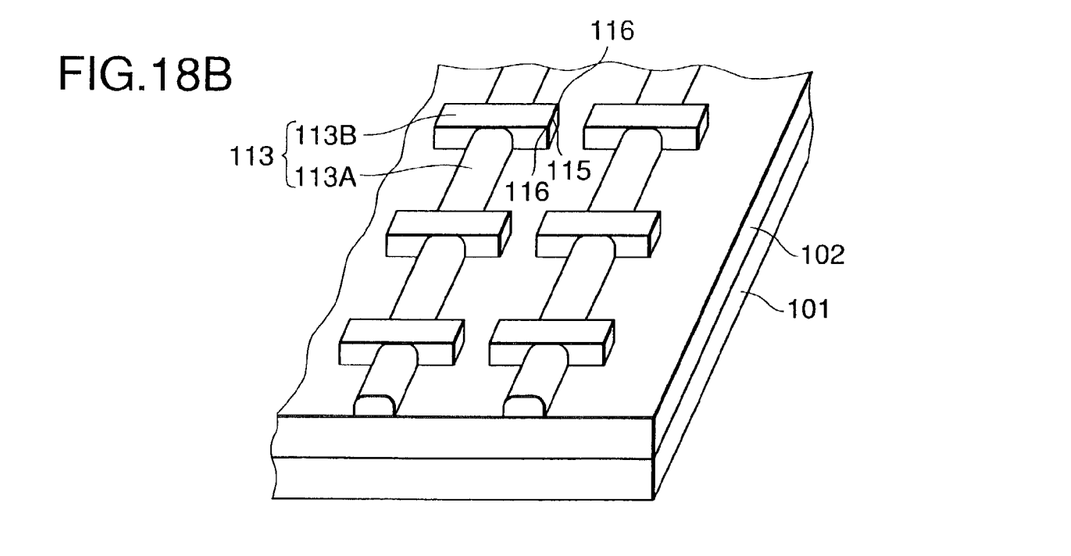
Figure 19A:
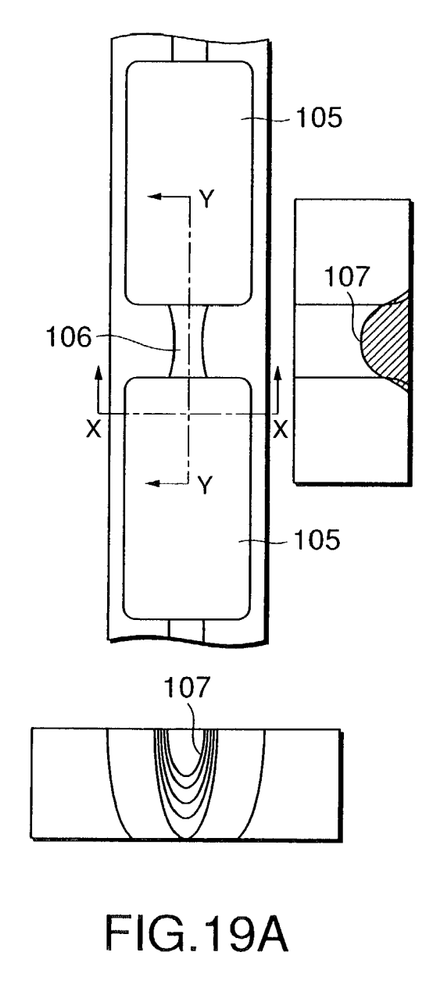
FIGS. 19A and 19B are top views and sectional views of discharge spaces and exhaust grooves of display panels of the fifth embodiment (A) of the present invention and the prior art (B)
Figure 19B:
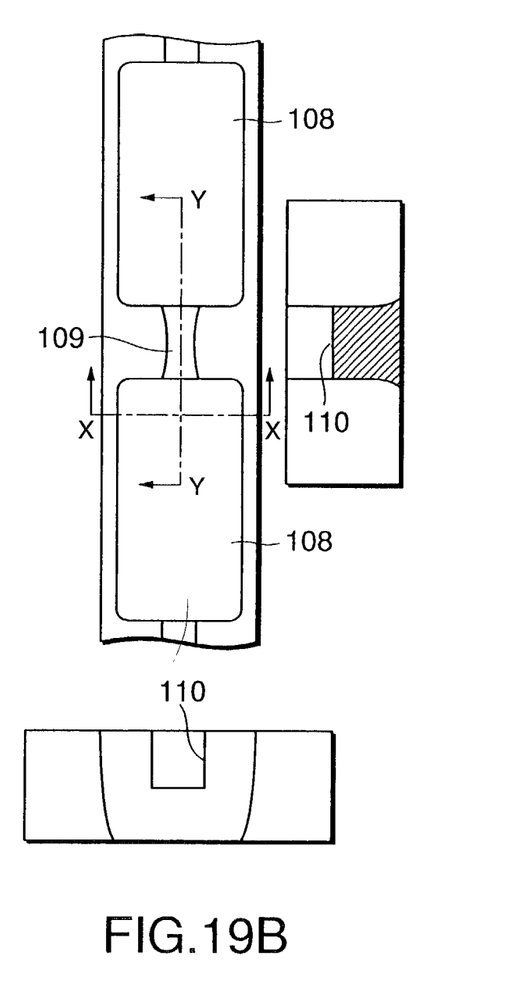

As shown in FIG. 18A, mixed paste of glass and filler is first applied onto a glass substrate 101 and dried to form a workpiece 102 and then, a flat dry-film resist having a resistance against sandblasting is contact-bonded to form a resist layer 103. The resist layer 103 has a thickness of 40 μm. Then, an exposure mask 104 is bonded onto the resist layer 103. The exposure mask 104 is formed by repeating an exposure mask pattern 104A having a large width in the horizontal direction of the paper surface and long extending in the vertical direction of the paper surface and an exposure pattern 104B having a small width in the horizontal direction of the paper surface and being short in the vertical direction of the paper surface. In the subsequent steps, a deep groove serving as a discharge space is formed on a workpiece 102 immediately below the exposure mask pattern 104A and a shallow groove serving as an exhaust groove is formed on a workpiece 102 immediately below the exposure mask pattern 104B. In this case, it is allowed to use a solid opaque film for the exposure mask patterns 104A and 104B. However, it is also possible to use one of slit opaque patterns shown in FIGS. 7A to 11A. In the case of this embodiment, right and left ends of the exposure mask pattern 104A are slit and the exposure mask pattern 104B use a solid opaque film.

Then, a mask 113 is formed by exposing and developing the resist layer 103 with UV rays by using the exposure mask 104 as a mask and then removing the exposure mask 104.

The mask 113 is formed by a mask pattern 113A long extending in the vertical direction of the paper surface and a mask pattern 113B protruding from the right and left of the mask pattern 113A in the vertical direction of the paper surface at cyclic intervals. Moreover, a flat mask pattern (whose sectional form is rectangular) is formed at the portion where the mask pattern 113B is added to the mask pattern 113A and a pattern whose sectional form is semicircular is formed at the portion formed by only the mask pattern 113A.

Then, the workpiece 102 is sandblasted by using the mask 113 as a mask to pattern the workpiece. The abrasive for sandblasting uses calcium carbonate. Then, the mask 113 is removed to complete the manufacturing step of the partition for constituting the discharge space and exhaust groove of the plasma display panel of this embodiment.

Because the mask pattern 113A has a semicircular sectional form, the maximum influencing distance of its stripping flow is short. Moreover, the interval between two adjacent mask patterns 113A is long. Therefore, even if doubling the maximum influencing distance of the stripping flow of the mask pattern 113A, the doubled distance is shorter than the interval between the two adjacent mask patterns 113A and the sandblasted depth reaches up to a glass substrate. This portion serves as a discharge space. However, because the mask pattern 113B has a rectangular sectional form, the maximum influencing distance of its stripping flow is comparatively long. Moreover, the interval between the two mask patterns 113B adjacent in the horizontal direction of the paper surface is short. Therefore, by doubling the maximum influencing distance of the stripping flow between the mask patterns 113B, the doubled value becomes longer than the interval between the two mask patterns 113B adjacent in the horizontal direction of the paper surface. Therefore, the sandblasted depth does not reach the glass substrate between the two mask patterns 113B adjacent in the horizontal direction of the paper surface but it becomes shallow. This portion serves as the exhaust groove.

FIG. 19A shows a top view of two discharge spaces 105 and one exhaust groove 106 thus formed in the partition and sectional views taken along the lines X—X and Y—Y. As shown by the sectional view taken along the line X—X, an exhaust groove bottom 107 forms a U-shape at any portion of the groove. In addition, because the workpiece 102 immediately below the center 115 of an end of the mask pattern 113B is strongly influenced by the stripping flow from the mask pattern 113B opposite to the horizontal direction of the paper surface compared to the workpiece 102 immediately below the vertex 116 of the end of the mask pattern 113B, the center of the exhaust groove becomes shallow in machined depth compared to the vicinity of the discharge space. When viewing the above state in the sectional view taken along the line Y—Y, the exhaust groove bottom 107 most rises at the center of the exhaust groove and lowers up to the bottom of the discharge space in the portion. As a whole, the exhaust groove bottom 107 has the shape of the saddle of a horse.

FIG. 19B shows a top view of two discharge spaces 108 and one exhaust groove 109 in the partition of a conventional plasma display and sectional views taken along the lines X—X and Y—Y. As shown by the sectional views taken along the lines X—X and Y—Y, the prior art is not manufactured by considering the concept of the maximum influencing distance of a stripping flow like the case of the present invention and no stripping flow is present in forming an exhaust groove. Therefore, the whole exhaust groove has a shape close to a rectangle and the whole groove bottom is flat. In the case of the prior art, because the exhaust groove has the above shape, an airflow is disordered at the boundary between the exhaust groove and a discharge space to cause a turbulent flow.

In the case of a machined pattern of the present invention, however, the exhaust groove bottom 107 has a U-shaped sectional form whose depth gradually changes. Therefore, no turbulent flow occurs at the boundary between an exhaust groove and a discharge space when air moves under exhausting. Therefore, it is possible to suppress occurrence of a turbulent flow and reduce an exhaust resistance.

Sixth Embodiment

Figure 20:
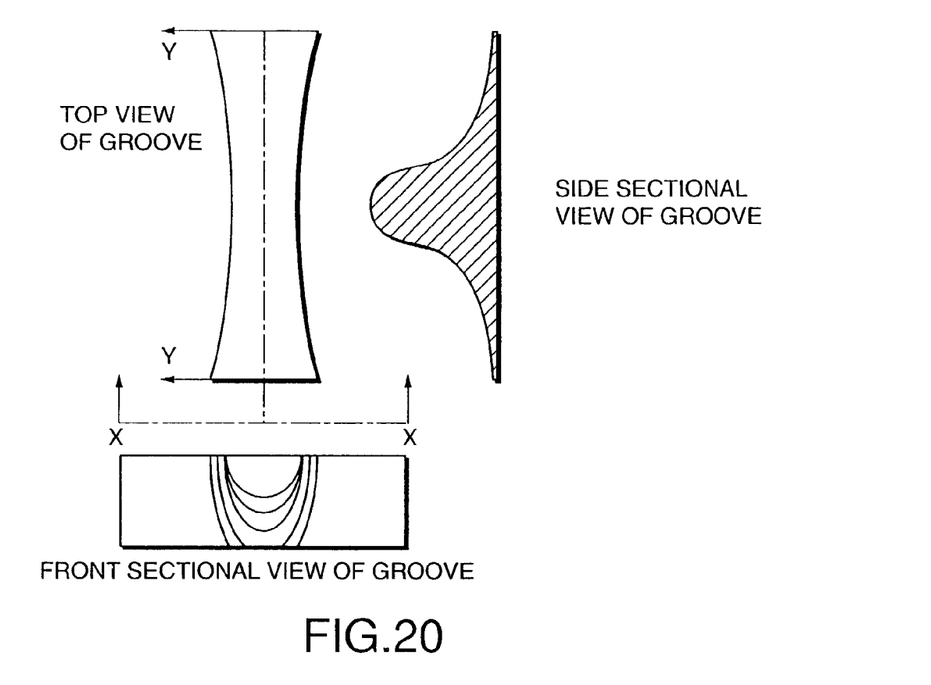
FIG. 20 is an illustration showing a top view and sectional views of the exhaust groove of a display panel of sixth embodiment of the present invention.

FIG. 20 shows a top view of the exhaust groove of a display panel of sixth embodiment of the present invention and its sectional views taken along the lines X—X and Y—Y.

This embodiment uses an exposure pattern whose width gradually decreases and increases along the longitudinal direction of a groove instead of the exposure mask pattern 104B used for the fifth embodiment shown in FIG. 18. When performing exposure and development by the exposure mask pattern similarly to the case of the fifth embodiment, the interval between central portions of ends of two adjacent mask patterns 113B becomes smaller than the interval between vertexes of the ends. In the case of an exhaust groove formed through sandblasting by using the above pattern masks as masks, the groove width decreases at the central portion of the exhaust groove as shown by the top view. Moreover, as shown in the both sectional views, the groove depth decreases at the central portion of the exhaust groove and the cross section along the longitudinal direction of the groove at the exhaust groove bottom becomes a normal-distribution curve. That is, the exhaust groove bottom further rises at the central portion of the exhaust groove and further lowers nearby the discharge space compared to the exhaust groove bottom of the fifth embodiment shown in FIG. 19A.

Seventh Embodiment

Figure 21:
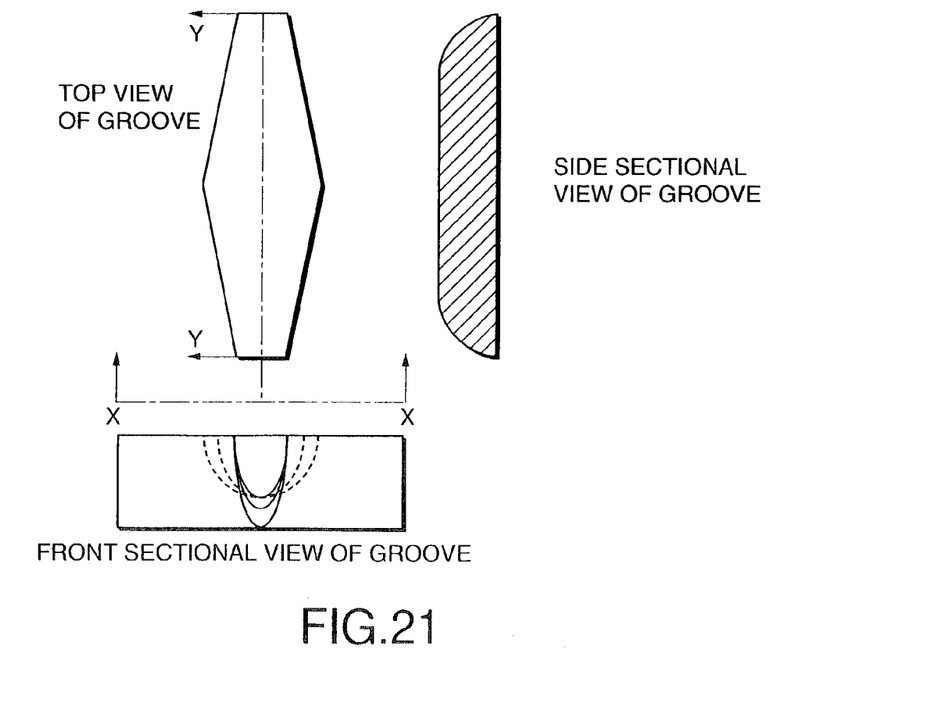
FIG. 21 is an illustration showing a top view and sectional views of the exhaust groove of a display panel of seventh embodiment of the present invention.

FIG. 21 shows a top view and sectional views taken along the lines X—X and Y—Y of the exhaust groove of a display panel of seventh embodiment of the present invention.

This embodiment uses an exposure pattern whose width gradually increases and decreases along the longitudinal direction of a groove compared to the exposure mask pattern 104B of the fifth embodiment shown in FIG. 18 inversely to the case of the sixth embodiment. A mask pattern is formed by performing exposure and development by the exposure mask pattern similarly to the case of the fifth embodiment. In the case of an exhaust groove formed through sandblasting by using the mask pattern as a mask, the groove width increases at the central portion of the exhaust groove as shown by the top view in FIG. 21. Moreover, the exhaust groove bottom lowers and becomes flat at the central portion of the exhaust groove compared to the exhaust groove bottom of the fifth embodiment shown in FIG. 19A. That is, as shown in FIG. 21, the exhaust groove bottom has a U-shape whose depth gradually changes nearby the discharge space of the exhaust groove and has a U-shaped structure whose depth is constant and whose width changes at the central portion.

Groove shapes of the sixth and seventh embodiments formed as described above respectively have a U-shaped sectional form in which connective shapes between the discharge space of a deep machined pattern and the exhaust groove of a shallow machined pattern are smoothly changed in depth and size similarly to the case of the groove shape of the fifth embodiment. Therefore, it is possible to suppress the turbulence of an airflow generated at the joint when air moves due to exhausting and the occurrence of a turbulent flow and decrease an exhaust resistance. Which groove shape should be used among these groove shapes is properly decided in accordance with the purpose.

The present invention is described above in accordance with the preferred modes and embodiments. However, a patterned product and its manufacturing method of the present invention are not restricted to only the above modes and embodiments. Various modified patterned products and their manufacturing methods are included in the range of the present invention as long as the gist of the present invention is not changed. For example, though an abrasive uses calcium carbonate, it is also allowed to use abrasive grains such as alumina or silicon carbide. Moreover, though mixed paste of glass and filler is used a workpiece, a mixture obtained by adding resin to glass powder having a low melting point is generally used. It is possible to use abrasives and workpieces by optionally combining them. Moreover, though a negative dry-film resist is used for a mask material, it is also allowed to use a positive dry-film resist or liquid resist. Furthermore, it is allowed to use any jet machining method such as liquid honing. Furthermore, though two levels of machined depths are used, it is allowed to use three levels or more. The number of levels of machined depths is not restricted.

As described above, a patterned-product manufacturing method of the present invention has a feature that it is possible to adjust the maximum influencing distance of a stripping flow by changing opening widths between and sectional forms of masks in the jet polishing using a viscous flow. Therefore, it is possible to simultaneously form machined patterns having different depths in a small number of steps.

Moreover, a patterned product of the present invention has a feature that it has a U-shaped sectional form in which depths and widths are smoothly changed. Therefore, in the application to formation of grooves on the discharge space and exhaust groove of a display device, it is possible to avoid the turbulence of an airflow generated at the joint between the discharge space and exhaust groove when air moves under exhausting and thereby, suppress the occurrence of a turbulent flow and reduce an exhaust resistance.

What is claimed is:

1. A patterned-product manufacturing method comprising the step of:
    (1) forming a workpiece on a substrate;
    (2) forming a mask pattern on the workpiece; and
    (3) machining the workpiece by a polishing method using a viscous flow including an abrasive by using the mask pattern as a mask, wherein at least machined patterns having different depths are simultaneously formed by the mask pattern of only one layer formed in the step (2).

2. The patterned-product manufacturing method according to claim 1, wherein the mask pattern has at least two different pattern intervals.

3. The patterned-product manufacturing method according to claim 2, wherein an upper face of at least a part of a region of the mask pattern is not flat.

4. The pattern-product manufacturing method according to claim 1 wherein the mask pattern has a first sectional form and a second sectional form which is different from the first sectional form.

5. The pattern-product manufacturing method according to claim 4, wherein a maximum-influential distance of a stripping flow of the first sectional form is longer than that of the second sectional form.

6. The patterned-product manufacturing method according to claim 5, wherein the sectional form of the upper face of the mask pattern is any one of almost flat, U-shaped, V-shaped, W-shaped, semicircular, and triangular.

7. The patterned-product manufacturing method according to claim 2, wherein at least one of the intervals of the mask pattern is shorter than a distance that is twice as long as a maximum-influential distance of a stripping flow generated when machining the workpiece at an end of the mask pattern defining the at least one of the intervals.

8. The patterned-product manufacturing method according to any one of claims 1 to 6, wherein the interval between two faced ridges of the above two adjacent mask patterns changes along a ridge.

9. The patterned-product manufacturing method according to any one of claim 1 to 6, wherein the polishing method using the viscous flow is a sandblasting method.

10. The patterned-product manufacturing method according to any one of claims 1 to 6, wherein the mask pattern is formed by a photosensitive material.

11. The patterned-product manufacturing method according to claim 10, wherein the photosensitive material is a dry film resist.

12. The patterned-product manufacturing method according to claim 10, wherein an exposure mask for forming the mask pattern has a half-tone exposure region and the light transmission quantity of the half-tone exposure region changes correspondingly to a necessary film thickness of the region of a mask pattern corresponding to the region of the exposure mask.

13. The patterned-product manufacturing method according to claim 12, wherein a slit is formed on an opaque film of the half-tone region of the exposure mask.

14. The patterned-product manufacturing method according to claim 13, wherein the light transmission quantity of the half-tone exposure region is decided in accordance with the width and/or density of the slit.

* * * * *